United States Patent
Nakamura et al.

[11] Patent Number: 5,809,042
[45] Date of Patent: Sep. 15, 1998

[54] INTERLEAVE TYPE ERROR CORRECTION METHOD AND APPARATUS

[75] Inventors: Akio Nakamura, Kawasaki; Masayuki Murakami; Tsutomu Numata, both of Kanagawa-ken, all of Japan

[73] Assignee: International Business Machines Corporation, Armonk, N.Y.

[21] Appl. No.: 634,337

[22] Filed: Apr. 12, 1996

[30] Foreign Application Priority Data

Apr. 13, 1995 [JP] Japan ................................. 7-088504

[51] Int. Cl.⁶ ........................................... G06F 11/10
[52] U.S. Cl. ...................... 371/37.5; 371/37.4; 371/37.8; 371/41
[58] Field of Search ................. 371/37.1, 37.4, 371/37.5, 37.7, 39.1, 38.1, 40.11, 41, 42, 37.05, 37.07, 43.1, 46

[56] References Cited

U.S. PATENT DOCUMENTS

| | | | |
|---|---|---|---|
| 5,051,998 | 9/1991 | Murai et al. | 371/37.1 |
| 5,224,106 | 6/1993 | Weng | 371/37.4 |
| 5,392,299 | 2/1995 | Rhines et al. | 371/37.5 |
| 5,546,409 | 8/1996 | Karasawa | 371/37.4 |

*Primary Examiner*—Reba I. Elmore
*Assistant Examiner*—Thomas E. Brown
*Attorney, Agent, or Firm*—David W. Lynch

[57] ABSTRACT

An improvement in an interleave type error correction method in which more errors can be corrected with less correction codes is provided. Array patterns of code words constituting the information code is form by interleaving. The array patterns comprise a plurality of sequences of a plurality of code words. Correction codes are added to the sequences so that a total number of the correction codes added to a selected sequence is greater than a total number of the correction codes added to the other sequences. An error correction is executed in the selected sequence by identifying a position of an error as a consecutive error code position, when the selected sequence is determined to contain said error having a characteristic feature that the error extends over other sequences. A code word of a position corresponding to said consecutive error code position of the selected sequence among code words in the other sequences is recognized as an erasure. Error correction in the other sequences are executed by a method of correcting a disappearance error based on information on the recognized erasure. In addition, an encoder, decoder, and data communication system which implements the error correction method are provided.

11 Claims, 5 Drawing Sheets

INTERLEAVE TYPE ERROR CORRECTION METHOD AND APPARATUS

FIELD OF THE INVENTION

The present invention relates to a code error correction, and more particularly to an interleave type error correction method particularly adapted to a communication channel where there occurs a burst error which is a long consecutive error.

BACKGROUND OF THE INVENTION

In a case where a burst error, being a long consecutive error, and a single random error both exist in data, a conventional method for correcting these errors is a method which encodes an error by interleaving and corrects with an error correction code (ECC). In this conventional interleave method, first, only the 0 byte of each of a sequence of code words (of one block) is arranged in the vertical direction and is encoded. If the encoding of all of the 0 bytes of the code words has been completed, then only the 1 bytes of the code words will likewise be arranged in the vertical direction and are encoded. Thereafter, for each block of a sequence of a plurality of rectangular blocks, all the bytes of a sequence of code words of one block are written to the one block in the same way described above. On the other hand, when decoding, all of the code words in a specific block are decoded for each one horizontal row of that block and successively decoded one horizontal row by one horizontal row. By this interleaving, m errors contained in one burst error are dispersed spaciously between m consecutive code words. That is, all or many of the m errors can be prevented from entering into one code word. If this interleaving is in a circumstance where it operates correctly, there will be no situation that exceeds its ability of correcting an error of each code word.

A Reed-Solomon code (RS code) is one of many ECCs which is widely used. The RS code is a byte correction code on a finite body. The finite body is expressed by GF(q) where q represents the power of a prime number. A value of $2^8$ is generally used as a value of this q. Also, if some Reed-Solomon code is expressed as an [n, k] RS code, it will be an RS code where the length of an encode word is n bytes ($n \leq q-1$) and the number of information bytes is k bytes. In this case, the number of redundant bytes being a check symbol portion, r, is r=n−k, and the design distance of a code, d, is d=(n−k)+1. When an error and an erasure are corrected with the [n, k] RS code, s errors and t erasures which satisfy $2s+t \leq (n-k)$ can be corrected. The "erasure" used herein means that it is a sort of error and the position where it was generated is known (but, the correct signal value is unknown). The "error" used herein means a normal error and not an "erasure.") Since one error is equivalent to about two erasures, it will be possible to increase the ability of a decoder without increasing the degree of redundancy if a certain error among errors is handled as an erasure.

A conventional error correction method of an information block by interleaving interleaves an information block to k blocks to generate k sequences, as shown in FIG. 5. The respective blocks are arranged so that the first block is a sequence 1, the second block is a sequence 2, etc., the kth block is a sequence k, the (k+1)th block returns to the sequence 1, and blocks are arranged until the last block, $I_{end}$. The sequences 1 to k are determined in this way, and check blocks are added to the sequences, respectively. The number of check blocks to be added to each sequence is the same, and the check block performs the error correction of the corresponding sequence. If the number of check symbols to be added to each sequence is expressed in terms of d, the number of correctable errors in each sequence, t, will be t=[d/2] in the RS code ([x] is the maximum integral number not exceeding "x").

Techniques for increasing the number of correctable errors are as follows: (a) the length of a check symbol portion is increased to make a design distance d longer; (b) information on the position where a disappearance occurred from some other parts different from the encoding and decoding parts related to a communication channel is received, and based on this information of the disappearance position, decoding by an error disappearance correction method is performed; and (c) an information symbol portion is divided into a plurality of blocks by interleaving, and the number of correctable errors is increased by repeatedly using one decoder by the number of blocks. Since the check symbol portion becomes longer as in the case of (a) but the design distance does not need to be increased, hardware can be realized with a smaller circuit scale than (a).

If the above described techniques are compared by a decoding rate, i.e. the number of correctable errors to the number of check symbols added, the decoding rate will become (b)>(a)=(c) in the case of, for example, a general BCH code (Bose-Chadhuri-Hocquenghem code). The technique of (b) can correct most errors, but since it requires external information on an error position, means for providing error position information to the system is additionally needed.

As described above, when it is desired to correct more errors, the check symbol portion is increased or information on an error position is obtained from the outside. However, in the former case the degree of redundancy is increased and in the latter case an additional function is needed. Therefore, neither is an ideal countermeasure.

A need exists for a correction method which is capable of minimizing an increase in a check symbol portion and correcting more errors without external information on an error position.

The present invention provides a solution to these and other problems, and offers other advantages over the prior art.

SUMMARY OF THE INVENTION

To solve the problems described above, encoding is performed by an interleaving method using two codes different in design distance. In an interleaved sequence where the design distance thereof is longer, more errors can be corrected. Based on information on the position of the corrected error, the ability of error correction in other sequences where the design distance is shorter can be increased over the ability of error correction determined by an actual design distance.

More specifically, in a selected sequence to which a plurality of correction codes have been added, an error correction is executed based on the added correction codes. When it is determined that the selected sequence has an error having a characteristic feature by which it is determined to be an error extending over other sequences, a position of the error is identified as a consecutive error code position. Among code words in general sequences to which less correction codes have been added, the code word of a position corresponding to the consecutive error code position of the selected sequence is recognized as an erasure. And, an error correction in the general sequences is executed based on the correction codes added to said general sequences, by a method of correcting a disappearance error based on information on the recognized erasure.

These and various other features as well as advantages which characterize the present invention will be apparent upon reading of the following detailed description and review of the associated drawings.

DETAILED DESCRIPTION

Figure 1:
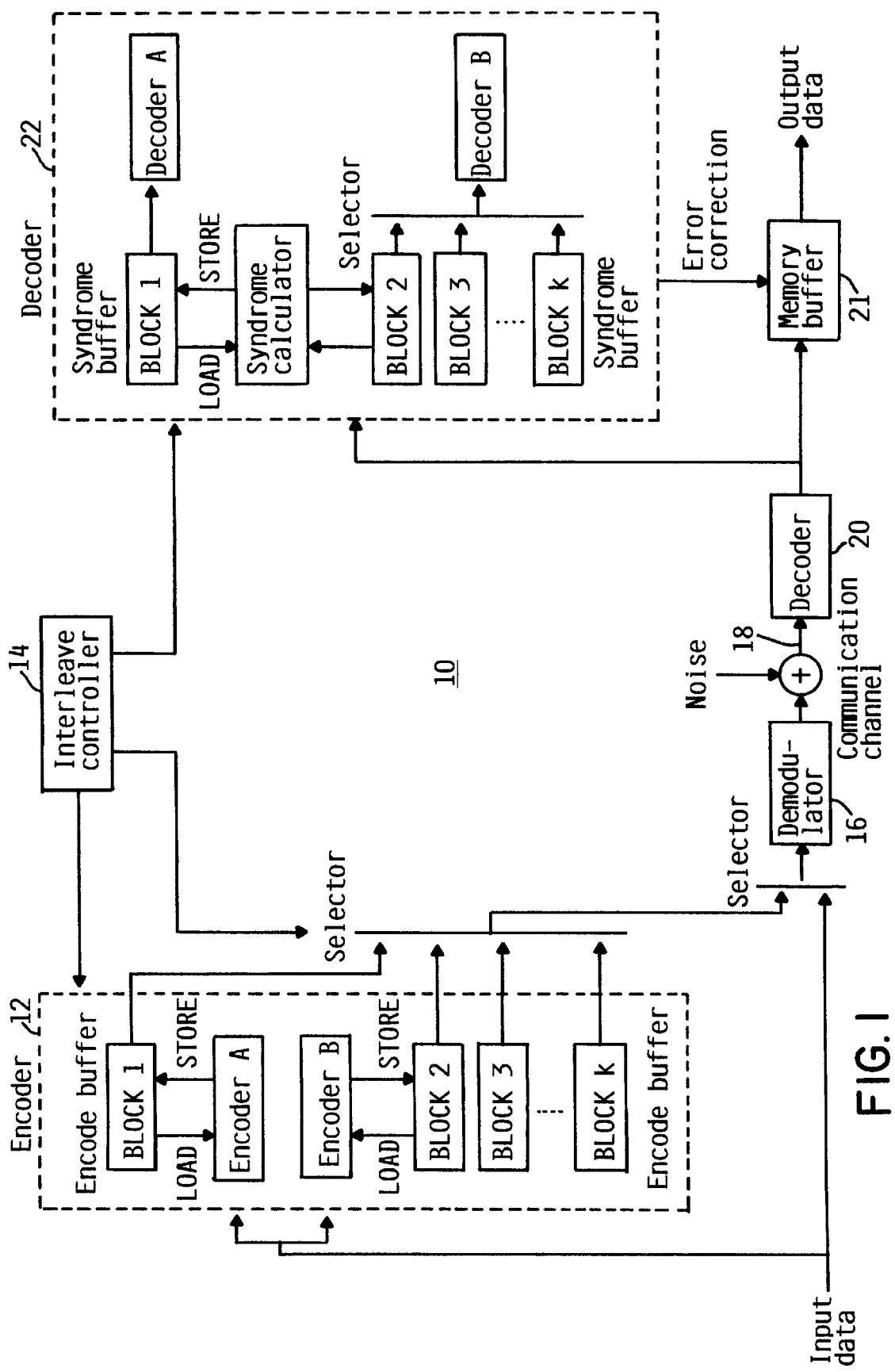
FIG. 1 is a block diagram showing a device for encoding and decoding data of an embodiment of the present invention.

A preferred embodiment of the present invention will hereinafter be described with reference to the accompanying drawings. FIG. 1 shows a device 10 constructed in accordance with the embodiment of the present invention. This device 10 is a device for encoding and decoding digital data that is transferred through a communication channel generating random errors and burst errors. As shown, the device 10 includes an encoder 12, which converts a digital input data into a stream of symbols being the constitutional elements of an encoded word. Rearranging of the order, i.e. rearranging to a plurality of sequences, is executed by an interleave controller 14. Then, the encoder 12 calculates an encoded portion for each sequence.

A decoder 20 processes a signal transferred from a demodulator 16 through a communication channel into a digital data form and restores a stream of symbols therefrom (the stream of symbols thus restored having been deteriorated because of noises on the channel). Then, the stream of the restored, i.e. demodulated, symbols is sent to a memory buffer 21 and, at the same time, is sent to a syndrome calculator within the decoder 22. The interleave controller 14 calculates a syndrome for each block with time division control, and based on a value of the calculated syndrome of each block, an error position and an error value are calculated by a decoder A and a decoder B.

This decoding is performed for each block. That is, if decoding one block is completed, then the next block will be decoded. Moreover, among each block, the sequences thereof are decoded consecutively. More specifically, if the blocks of the sequence 1, for example, are decoded consecutively and all blocks are encoded, then the blocks of the sequence 2 will be decoded. The sequences thereafter are processed in the same way. This decoding process is advanced without any delay, as long as an uncorrectable error is not detected.

Figure 2:
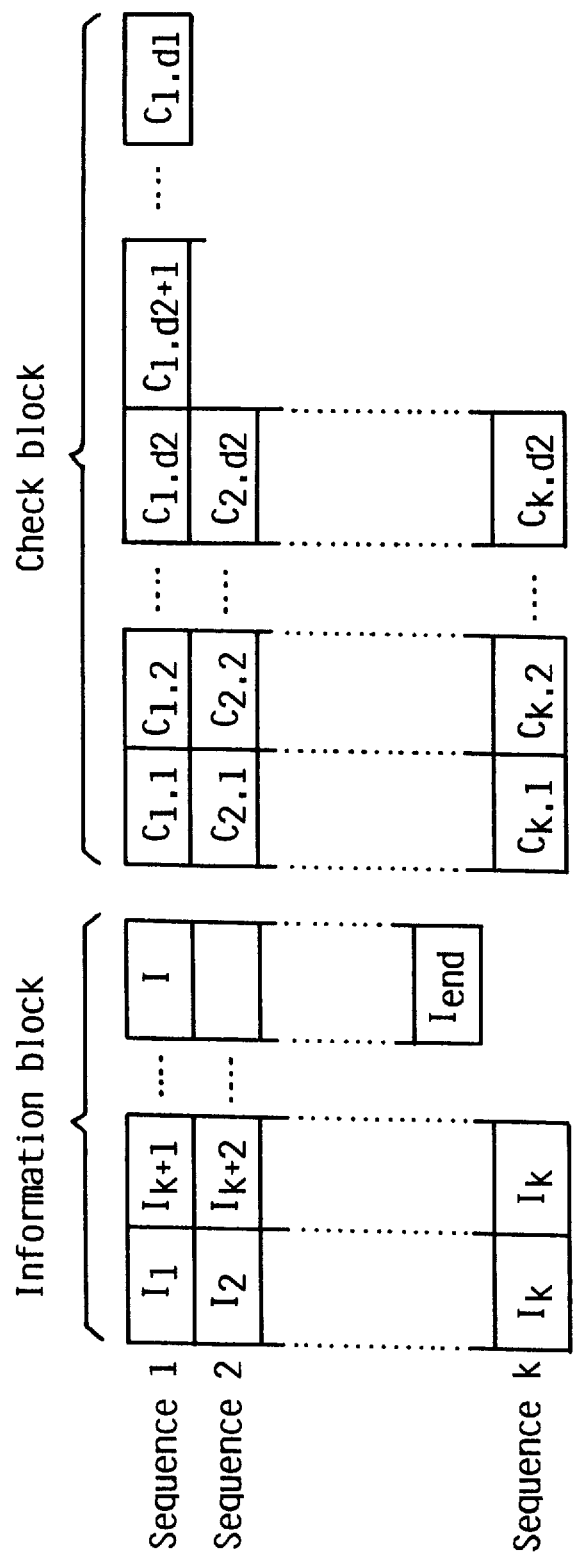
FIG. 2 is a diagram showing a data sequence by data interleaving of the embodiment of the present invention and a corresponding check block.

The encoding of data sequences according to an embodiment of the present invention will be described with reference to FIG. 2. An information block is interleaved to obtain k sequences. Information blocks $I_1$, $I_2$, $I_3$, etc., and $I_k$ are arranged in sequences 1, 2, 3, etc., and k, respectively. Information block $I_{k+1}$ returns to the sequence 1, and information blocks $I_{k+2}$ and $I_{k+3}$ are again arranged in the sequences 2 and 3, respectively. In this way, information blocks are arranged in k sequences until the last $I_{end}$.

A check symbol is added to each sequence, but in the preferred embodiment one sequence is selected from the k sequences. A longer check symbol than those of the other sequences is added to the selected sequence. In this embodiment, $d_1$ check symbols are added to the sequence 1, and $d_2$ check symbols ($d_1 > d_2$) are added to the sequences 2 to k, respectively. As a result, one sequence with a design distance $d_1 + 1$ is formed and (k−1) sequences with a design distance $d_2 + 1$ are formed.

If in each sequence the number of correctable errors is calculated for a Reed-Solomon (RS) code which is a representative BCH code, in the sequence 1 a maximum of $t_1$ errors ($d_2 = [d_1/2]$) can be corrected and in the remaining sequences 2 to k a maximum of $t_2$ errors ($t_2 = [d_2/2]$) can be corrected. Note that [x] represents a maximum integral number not exceeding "x".

Now, a possibility of correction of a burst error will be described. If it is assumed that a consecutive error of length L has occurred, in each sequence a maximum of $L_n$ consecutive errors ($L_{n=[L/k]+1}$) will occur. If $t_1 > L_n > t_2$, in the sequence 1 the correction can be made, but in the remaining sequences 2 to k the number of errors exceeds the number of correctable errors, so the correction cannot be made.

A preferred embodiment of the present invention provides a method which, even in such case, can make a correction in the sequences 2 to k. Now, when a correctable consecutive error of less than a length $t_1$ is detected during decoding of the sequence 1, it is assumed that errors exists in adjacent symbol positions of other sequences and, thereafter, each of these adjacent positions will be processed as an erasure. For example, when a consecutive error is detected in the blocks $I_{k+1}$, $I_{2k+1}$, and $I_{3k+1}$, it is assumed that in the remaining sequence 2 to k, for example, in the sequence 2, errors exist in the similar positions $I_{k+2}$, $I_{2k+2}$, and $I_{3k+2}$. Thereafter, these information blocks are processed as erasures. Therefore, when the decoding of the sequence 1 is completed and the sequence 2 is decoded, an error correction is executed by $d_2$ check blocks, based on the information that $I_{k+2}$, $I_{2k+2}$, and $I_{3k+2}$ each are an erasure. Likewise, in each of the following sequences 3 to k, an error correction is executed by check blocks based on the information that the similar positions are an erasure.

As described above, the "erasure" is a sort of error and the position where it was generated is known (but, the correct signal value is unknown). One error is equivalent to about two erasures. Therefore, if a certain error among errors is handled as an erasure, more errors can be corrected in the correction using a check block of predetermined length.

Therefore, even if the above described Ln errors corresponding to $t_1 > L_n > t_2$ existed in each of sequences 2 to k, it would become possible in each sequence to correct Ln errors by identifying part of these errors as an erasure and executing a correction process.

Figure 3:
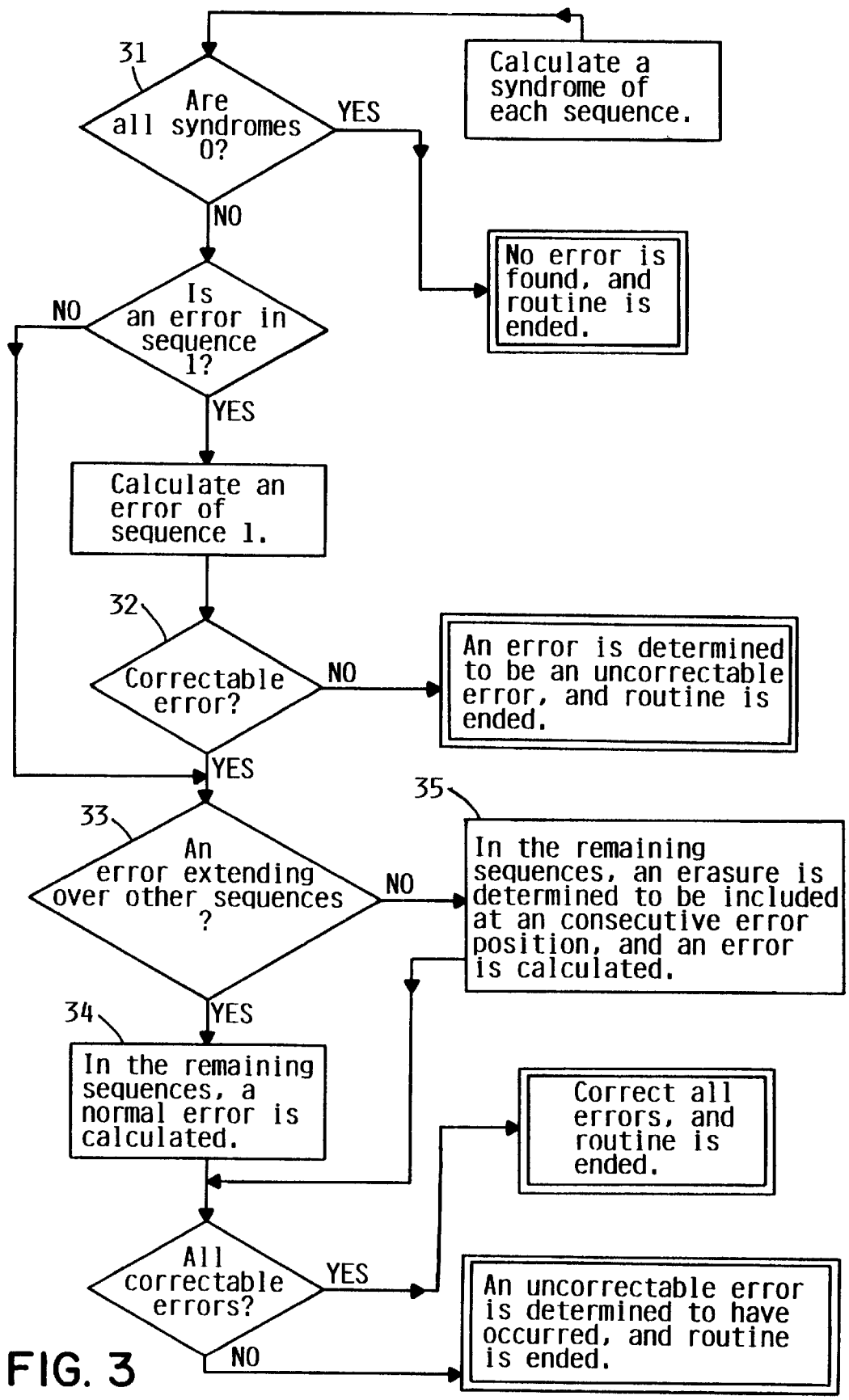
FIG. 3 is a flowchart showing an error correction method according to the embodiment of the present invention.

The error correction method according to the preferred embodiment will hereinafter be described according to a flowchart shown in FIG. 3. First, for each data sequence formed by interleaving, a syndrome is calculated in step 31. If in this step 31 it is determined that all syndromes are a 0, it will be determined that each sequence has no error, so the error correction routine will be ended. If it is determined that an error exists in sequence 1, in step 32 it is determined if the error in sequence 1 is correctable. Since a longer check symbol has been added to sequence 1, as described above, the ability of correcting errors is greater than in other sequences. Therefore, when it is determined that correction is impossible even with this longer check symbol, it is determined that no correctable error exists, and the error correction routine is ended. When correction is possible, in step 33 it is determined, from the characteristic feature of the error position of sequence 1, if a consecutive error extending over other sequences exists.

Whether in step 33 a consecutive error extending over other sequences exists is determined as follows. When an error is detected in sequence 1 in two or more consecutive positions, or only when an error is detected in three or more consecutive positions or four or more consecutive positions in sequence 1, the error is determined to be a consecutive error extending over other sequences. This reference may be determined depending on the reliability of a system. Also, when an error is detected at intervals of two positions in sequence 1, this can be determined to be a consecutive error extending over other sequences.

When it is determined, according to these references of determination, that an error extending over other sequences exists, step 33 advances to step 35. For the remaining sequences, the position corresponding to the error position of sequence 1 is considered as an erasure and the error is calculated. When an error correction is possible, the error is corrected and then this routine is ended. When, on the other hand, an error correction is impossible, the error is determined to be uncorrectable and then this routine is ended. Since the check symbols added to other sequences are shorter than that added to sequence 1, the ability of correcting errors is low in a normal error correction. However, as described above, the error correction ability can be increased by identifying an actual error as an erasure.

When in step 33 it is determined that no consecutive error extending over other sequences exists, in step 34 and subsequent steps a normal error correction is performed in other sequences.

Figure 4:
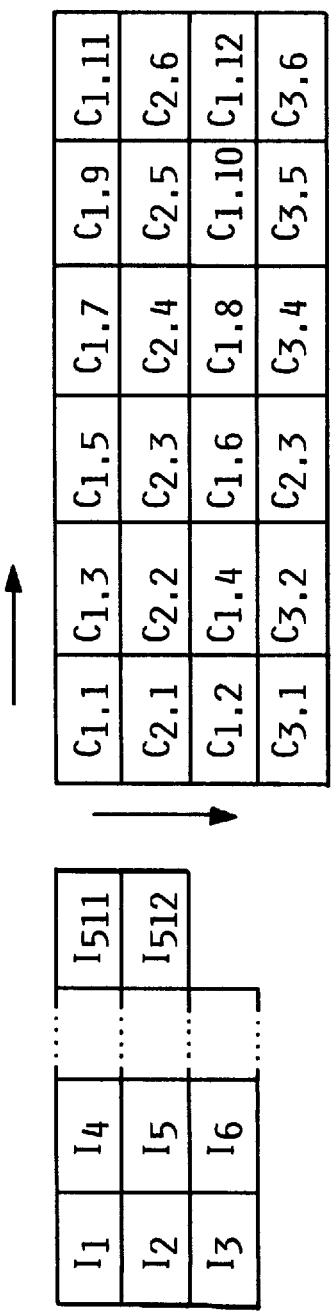
FIG. 4 is a diagram showing an concrete example of a data sequence by data interleaving of the embodiment of the present invention and an concrete example of a corresponding check block.

It is preferable that the check block to be added to the data sequence 1 where its design distance is made longer in view of a possibility of burst errors in the check blocks added to each data sequence be selected so that, if possible, the distance between the check symbols becomes uniform in the entire arrangement. For example, when as shown in FIG. 4, an information block of 512 bytes is divided into three data sequences (1 symbol=1 byte) and check blocks of 12 bytes, 6 bytes, and 6 bytes are added to data sequences 1, 2, and 3, respectively, it is preferable that each check block is arranged as shown in FIG. 4. If it is assumed that check blocks to be added to data sequence 1 are $c_{1,1}$ to $c_{1,12}$, check blocks to be added to data sequence 2 are $c_{2,1}$ to $C_{2,6}$, and check blocks to be added to data sequence 3 are $C_{3,1}$ to $C_{3,6}$, check symbols to be added to the sequence 1 will be arranged so that a predetermined distance between check symbols is maintained, as shown in FIG. 4. With this arrangement, the encoding ability is increased with respect to burst errors.

Figure 5:
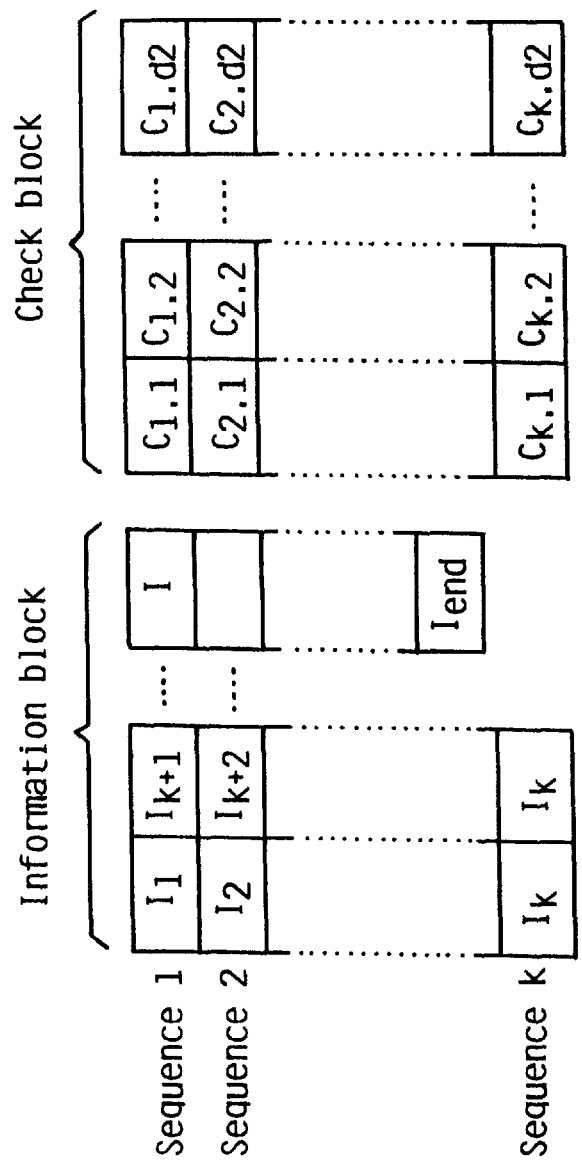
FIG. 5 is a diagram showing a data sequence by conventional data interleaving and a corresponding check block.

As has been described hereinbefore, an preferred embodiment of the present invention forms a plurality of sequences by an interleaving method using two codes different in design distance and executes an error correction. This provides an advantage through the ability of encoding an error correction code which can be increased over that of the conventional method shown in FIG. 5, and external error position information is not needed.

It is to be understood that even though numerous characteristics and advantages of the present invention have been set forth in the foregoing description, together with details of the structure and function of the invention, this disclosure is illustrative only, and changes may be made in detail within the principles of the present invention to the full extent indicated by the broad general meaning of the terms in which the appended claims are expressed without departing from the scope and spirit of the present invention. In addition, it will be appreciated by those skilled in the art that the teachings of the present invention can be applied to other systems without departing from the scope and spirit of the present invention.

What is claimed is:

1. An interleave type error correction method of adding an error correction code to an information code and an error correction code to a data error, comprising the steps of:

(a) forming array patterns of code words constituting said information code by interleaving, the array patterns comprising a plurality of sequences each comprising a plurality of code words;

(b) adding correction codes to said plurality of sequences so that a total number of the correction codes to be added to a sequence selected from said plurality of sequences is greater than a total number of the correction codes to be added to the other sequences in said plurality of sequences;

(c) executing an error correction in said selected sequence, based on the correction codes added to the selected sequence, by identifying a position of an error as a consecutive error code position, when said selected sequence is determined to contain said error having a characteristic feature that the error extends over other sequences;

(d) recognizing as an erasure a code word of a position corresponding to said consecutive error code position of said selected sequence among code words in said other sequences of said plurality of sequences to which said correction codes have been added; and (e) executing an error correction in said other sequences of said plurality of sequences, based on said correction codes added to said other sequences of said plurality of sequences, by a method of correcting a disappearance error based on information on the recognized erasure.

2. The interleave type error correction method of claim 1 wherein said selected sequence of said plurality of sequences comprises only one sequence.

3. The interleave type error correction method of claim 1 wherein the total number of said correction codes to be added to said selected sequence is determined so that a total number of errors in said selected sequence that can be corrected by said correction codes to be added to said selected sequence becomes more by at least one or more than the number of errors that can be corrected based on said correction codes to be added to said other sequences of said plurality of sequences by an error correction method that does not use a disappearance error correction method.

4. An encoder which adds an error correction code to an information code for use in a data communication system which communicates the information code over a communication channel which may introduce random and burst errors to the information code, comprising:

(a) interleave controller which forms array patterns of code words from said information code, the array patterns comprising a plurality of sequences each comprising a plurality of code words; and (b) error encoding means, operatively coupled to the interleave controller, for adding correction codes to said plurality of sequences so that a total number of the correction codes to be added to a sequence selected from said plurality of sequences is greater than a total number of the correction codes to be added to the other sequences in said plurality of sequences such that subsequent error correction of a disappearance error may be performed based on information on a recognized erasure.

5. The encoder of claim 4 wherein said selected sequence of said plurality of sequences comprises only one sequence.

6. The encoder of claim 4 wherein the total number of said correction codes to be added to said selected sequence is determined so that a total number of errors in said selected sequence that can be corrected by said correction codes to be added to said selected sequence becomes more by at least one or more than the number of errors that can be corrected based on said correction codes to be added to said other sequences of said plurality of sequences by an error correction method that does not use a disappearance error correction method.

7. A data communication system including a decoder which is operatively coupled to the encoder of claim 4 through the communication channel, the decoder correcting errors in the information code introduced by the communication channel, the decoder comprising:

(a) an error detector which determines if a selected sequence contains an error having a characteristic feature that the error extends over other sequences in said array patterns communicated over the communication channel;

(b) error correction means, operatively coupled to the error detector, for executing error correction in said selected sequence, based on correction codes added to the selected sequence, by (i) identifying a position of an error as a consecutive error code position, (ii) recognizing as an erasure a code word of a position corresponding to said consecutive error code position of said selected sequence among code words in said other sequences of said plurality of sequences to which said correction codes have been added, and (iii) executing an error correction in other sequences of said plurality of sequences, based on said correction codes added to said other sequences of said plurality of sequences, by a method of correcting a disappearance error based on information on the recognized erasure.

8. The data communication system of claim 7 wherein said selected sequence of said plurality of sequences comprises only one sequence.

9. The data communication system of claim 7 wherein the total number of said correction codes to be added to said selected sequence is determined so that a total number of errors in said selected sequence that can be corrected by said correction codes to be added to said selected sequence becomes more by at least one or more than the number of errors that can be corrected based on said correction codes to be added to said other sequences of said plurality of sequences by an error correction method that does not use a disappearance error correction method.

10. A decoder which corrects errors in an information code for use in a data communication system which receives the information code from a communication channel which may introduce random and burst errors to the information code, comprising:

(a) an error detector which determines if a selected sequence contains an error having a characteristic feature that the error extends over other sequences of a plurality of sequences in array patterns communicated over the communication channel, each sequence comprising a plurality of code words;

(b) error correction means, operatively coupled to the error detector, for executing error correction in said selected sequence, based on correction codes added to the selected sequence, by (i) identifying a position of an error as a consecutive error code position, (ii) recognizing as an erasure a code word of a position corresponding to said consecutive error code position of said selected sequence among code words in said other sequences of said plurality of sequences to which said correction codes have been added, and (iii) executing an error correction in other sequences of said plurality of sequences, based on said correction codes added to said other sequences of said plurality of sequences, by a method of correcting a disappearance error based on information on the recognized erasure.

11. The decoder claim 10 wherein said selected sequence of said plurality of sequences comprises only one sequence.

* * * * *